United States Patent
Li

(10) Patent No.: US 9,966,029 B2
(45) Date of Patent: May 8, 2018

(54) GATE DRIVER ON ARRAY CIRCUIT AND DISPLAY USING GATE DRIVER ON ARRAY CIRCUIT

(71) Applicant: WUHAN CHINA STAR OPTOELECTRONICS TECHNOLOGY CO., LTD., Wuhan, Hubei (CN)

(72) Inventor: Yafeng Li, Hubei (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 184 days.

(21) Appl. No.: 14/906,708

(22) PCT Filed: Jan. 13, 2016

(86) PCT No.: PCT/CN2016/070810
§ 371 (c)(1),
(2) Date: Jan. 21, 2016

(87) PCT Pub. No.: WO2017/101189
PCT Pub. Date: Jun. 22, 2017

(65) Prior Publication Data
US 2017/0270881 A1    Sep. 21, 2017

(30) Foreign Application Priority Data

Dec. 17, 2015 (CN) .......................... 2015 1 0953544

(51) Int. Cl.
*G09G 3/36* (2006.01)
*G09G 3/3266* (2016.01)

(52) U.S. Cl.
CPC ......... *G09G 3/3677* (2013.01); *G09G 3/3696* (2013.01); *G09G 3/3266* (2013.01); *G09G 2300/0842* (2013.01); *G09G 2300/0871* (2013.01); *G09G 2310/08* (2013.01); *G09G 2330/021* (2013.01)

(58) Field of Classification Search
CPC ............... G09G 3/3677; G09G 3/3696; G09G 2300/0842; G09G 2310/08; G09G 2310/021; G09G 3/3266; G09G 2300/0871
See application file for complete search history.

(56) References Cited

U.S. PATENT DOCUMENTS

| 7,949,086 B2 * | 5/2011 | Tsai | G11C 19/28 377/64 |
| 2004/0189584 A1 * | 9/2004 | Moon | G09G 3/20 345/100 |

(Continued)

*Primary Examiner* — Kenneth Bukowski
(74) *Attorney, Agent, or Firm* — Ladas & Parry LLP

(57) ABSTRACT

A GOA circuit includes GOA circuit units. Each of the GOA circuit units at each stage includes an input control module, an output control module, and a pull-down module. The pull-down module includes a first transistor, a second transistor, a third transistor, and a resistor. The GOA circuit unit uses fewer transistors and fewer capacitors. Therefore, the GOA circuit unit proposed by the present invention is beneficial for being used in displays with a narrow bezel. In addition, the GOA circuit unit omits a capacitor so power generated after the capacitor is charged is reduced. It provides a beneficiary effect of reducing power of the whole GOA circuit.

9 Claims, 2 Drawing Sheets

(56) References Cited

U.S. PATENT DOCUMENTS

| | | | |
|---|---|---|---|
| 2008/0266477 A1* | 10/2008 | Lee | G09G 3/3677 349/46 |
| 2011/0148853 A1* | 6/2011 | Ko | G09G 3/3677 345/213 |
| 2015/0279289 A1* | 10/2015 | Yu | G11C 19/28 345/690 |
| 2016/0343336 A1* | 11/2016 | Dai | G11C 19/184 |
| 2016/0351156 A1* | 12/2016 | Wu | G11C 19/28 |
| 2017/0256222 A1* | 9/2017 | Kuo | G09G 3/3677 |
| 2017/0301303 A1* | 10/2017 | Li | G09G 3/3677 |

* cited by examiner

GATE DRIVER ON ARRAY CIRCUIT AND DISPLAY USING GATE DRIVER ON ARRAY CIRCUIT

BACKGROUND OF THE INVENTION

1. Field of the Invention

The present invention relates to a display, and more particularly, to a display using a gate driver on array (GOA) circuit.

2. Description of the Prior Art

A gate driver is disposed on a glass substrate comprising a thin film transistor (TFT) in the process of a thin film transistor liquid crystal display (TFT-LCD) array for performing row-by-row scanning. This is what a GOA circuit is.

The GOA circuit comprises a plurality of GOA circuit units. Each of the plurality of GOA circuit units are fabricated from a plurality of transistors and a plurality of capacitors. The GOA circuit is formed on one lateral side of the glass substrate directly. So, the fewer the transistors and capacitors forming the GOA circuit unit are, the more the unoccupied room of the glass substrate for the GOA circuit is. A display comprising a GOA circuit unit comprising fewer transistors and capacitors is good to be equipped with a narrow frame.

Therefore, the IT industry strives to create a GOA circuit comprising a GOA circuit unit comprising fewer transistors and fewer capacitors.

SUMMARY OF THE INVENTION

An object of the present invention is to propose a GOA circuit and a display using the GOA circuit for resolving the problem occurring in the conventional technology.

According to the present invention, a GOA circuit comprises a plurality of GOA circuit units coupled in series. Each of the plurality of GOA circuit units at each stage is used for outputting a scanning signal at an output terminal according to a scanning signal output by a GOA circuit unit at a previous stage, a scanning signal output by a GOA circuit unit at a next stage, a first clock signal, a second clock signal, and a third clock signal. Each of the plurality of GOA circuit units at each stage comprises an input control module, an output control module, and a pull-down module. The input control module is used for outputting a controlling signal at a controlling node according to the first clock signal and the third clock signal. The output control module electrically connected to the controlling node, is used for outputting the scanning signal at the output terminal according to the controlling signal and the second clock signal. The pull-down module electrically connected to the output control module, is used for pulling the scanning signal down to be at low level. The pull-down module comprises a first transistor, a second transistor, a third transistor, and a resistor. The first transistor comprises a gate electrically connected to the controlling node, a drain electrically connected to a pull-down driving node, and a source electrically connected to a first constant voltage. The second transistor comprises a gate electrically connected to the pull-down driving node, a drain electrically connected to the output terminal, and a source electrically connected to the first constant voltage. The third transistor comprises a gate electrically connected to the pull-down driving node, and a source electrically connected to the first constant voltage. The resistor comprises two terminals electrically connected to a second constant voltage and the pull-down driving node, respectively.

In one aspect of the present invention, the input control module comprises a fourth transistor and a fifth transistor. The fourth transistor comprises a gate electrically connected to the first clock signal, a drain electrically connected to the scanning signal output by the GOA circuit unit at the previous stage, and a source electrically connected to the controlling node. The fifth transistor comprises a gate electrically connected to the third clock signal, a drain electrically connected to the controlling node, and a source electrically connected to the scanning signal output by the GOA circuit unit at the next stage.

In another aspect of the present invention, the output control module comprises a sixth transistor, a seventh transistor, and a capacitor. The sixth transistor comprises a gate electrically connected to the second constant voltage, a drain electrically connected to the controlling node, and a source electrically connected to a drain of the third transistor. The seventh transistor comprises a gate electrically connected to a source of the sixth transistor, a drain electrically connected to the second clock signal, and a source electrically connected to the output terminal. The capacitor is connected between the source and the gate of the seventh transistor, respectively.

In still another aspect of the present invention, a pulse of the first clock signal, a pulse of the second clock signal, and a pulse of the third clock signal are alternatively output, and the three pulses never overlap with one another.

In yet another aspect of the present invention, the first constant voltage is at low level, and the second constant voltage is at high level.

According to the present invention, a display comprises a source driver for outputting data signal to a plurality of pixel units to show images, and a gate driver on array (GOA) circuit. The GOA circuit comprises a plurality of GOA circuit units coupled in series. Each of the plurality of GOA circuit units at each stage is used for outputting a scanning signal at an output terminal according to a scanning signal output by a GOA circuit unit at a previous stage, a scanning signal output by a GOA circuit unit at a next stage, a first clock signal, a second clock signal, and a third clock signal. Each of the plurality of GOA circuit units at each stage comprises an input control module, an output control module, and a pull-down module. The input control module is used for outputting a controlling signal at a controlling node according to the first clock signal and the third clock signal. The output control module electrically connected to the controlling node, is used for outputting the scanning signal at the output terminal according to the controlling signal and the second clock signal. The pull-down module electrically connected to the output control module, is used for pulling the scanning signal down to be at low level. The pull-down module comprises a first transistor, a second transistor, a third transistor, and a resistor. The first transistor comprises a gate electrically connected to the controlling node, a drain electrically connected to a pull-down driving node, and a source electrically connected to a first constant voltage. The second transistor comprises a gate electrically connected to the pull-down driving node, a drain electrically connected to the output terminal, and a source electrically connected to the first constant voltage. The third transistor comprises a gate electrically connected to the pull-down driving node, and a source electrically connected to the first constant voltage. The resistor comprises two terminals electrically connected to a second constant voltage and the pull-down driving node, respectively.

In one aspect of the present invention, the input control module comprises a fourth transistor and a fifth transistor.

The fourth transistor comprises a gate electrically connected to the first clock signal, a drain electrically connected to the scanning signal output by the GOA circuit unit at the previous stage, and a source electrically connected to the controlling node. The fifth transistor comprises a gate electrically connected to the third clock signal, a drain electrically connected to the controlling node, and a source electrically connected to the scanning signal output by the GOA circuit unit at the next stage.

In another aspect of the present invention, the output control module comprises a sixth transistor, a seventh transistor, and a capacitor. The sixth transistor comprises a gate electrically connected to the second constant voltage, a drain electrically connected to the controlling node, and a source electrically connected to a drain of the third transistor. The seventh transistor comprises a gate electrically connected to a source of the sixth transistor, a drain electrically connected to the second clock signal, and a source electrically connected to the output terminal. The capacitor is connected between the source and the gate of the seventh transistor, respectively.

In still another aspect of the present invention, a pulse of the first clock signal, a pulse of the second clock signal, and a pulse of the third clock signal are alternatively output, and the three pulses never overlap with one another.

In yet another aspect of the present invention, the first constant voltage is at low level, and the second constant voltage is at high level.

Compared with conventional technology, the GOA circuit unit proposed by the present invention comprises fewer transistors and fewer capacitors. Therefore, the GOA circuit unit proposed by the present invention is beneficial for being used in displays with a narrow bezel. In addition, the GOA circuit unit omits a capacitor so power generated after the capacitor is charged is reduced. It provides a beneficiary effect of reducing power of the whole GOA circuit.

These and other features, aspects and advantages of the present disclosure will become understood with reference to the following description, appended claims and accompanying figures.

DETAILED DESCRIPTION OF THE PREFERRED EMBODIMENTS

Figure 1:
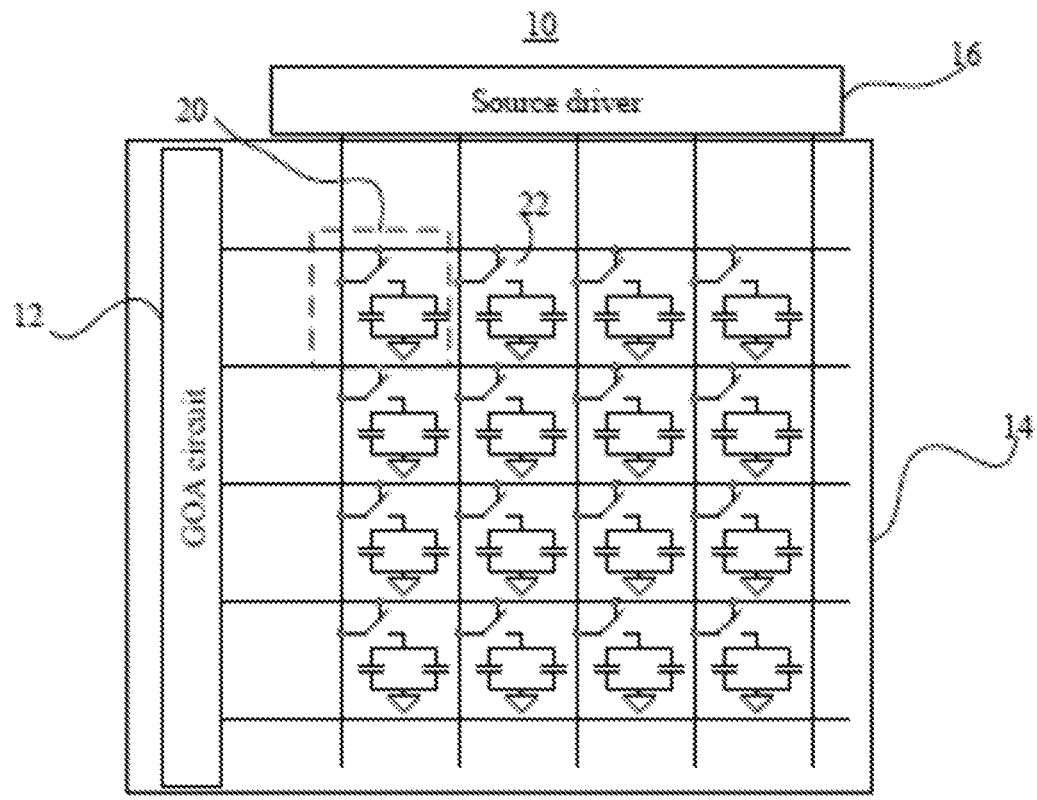
FIG. 1 is a function block diagram showing a display according to a preferred embodiment of the present invention.

Please refer to FIG. 1. FIG. 1 is a function block diagram showing a display 10 according to a preferred embodiment of the present invention. The display 10 may be a liquid crystal display (LCD) or an organic light emitting diode (OLED) display. The display 10 comprises a glass substrate 14 and a source driver 16. A plurality of pixels are arranged in a matrix on the glass substrate 14. A GOA circuit 12 is arranged on the glass substrate 14 as well. Each of the plurality of pixels comprises three pixel units 20. The pixel units 20 represents primary colors, i.e., red (R), green (G), and blue (B), respectively. Take the LCD 10 with a resolution of 1024×768 for example. The LCD 10 comprises 1024×768×3 pixel units 20. The GOA circuit 12 outputs a scanning signal to turn on the transistors 22 in each row consecutively. Meanwhile, the source driver 16 outputs a corresponding data signal to the pixel units 20 in an entire column to charge the pixel units 20 to fulfillment. Different grayscales are shown afterwards. After the transistors 22 in each row finish being charged, the scanning signal in the row of GOA circuits 12 is closed. Then, the GOA circuit 12 outputs a scanning signal to turn on the transistors 22 in the next row again. Subsequently, the source driver 16 charges and discharges the pixel units 20 in the next row. Step by step, after all of the pixel units 20 complete being charged, the pixel units 20 in the first row restart to be charged.

The trend for LCD panels is that the GOA circuit 12 outputs a scanning signal at regular intervals. Take the LCD 10 with a resolution of 1024×768 and a frame rate of 60 Hz for example. The show time for each frame is approximately $1/60$=16.67 ms. So the pulse of each scanning signal is 16.67 ms/768=21.7 μs. The pixel unit 20 is charged and discharged by the source driver 16 during the period of 21.7 μs until the needed voltage is achieved. As a result, the grayscale in contrast is shown.

Figure 2:
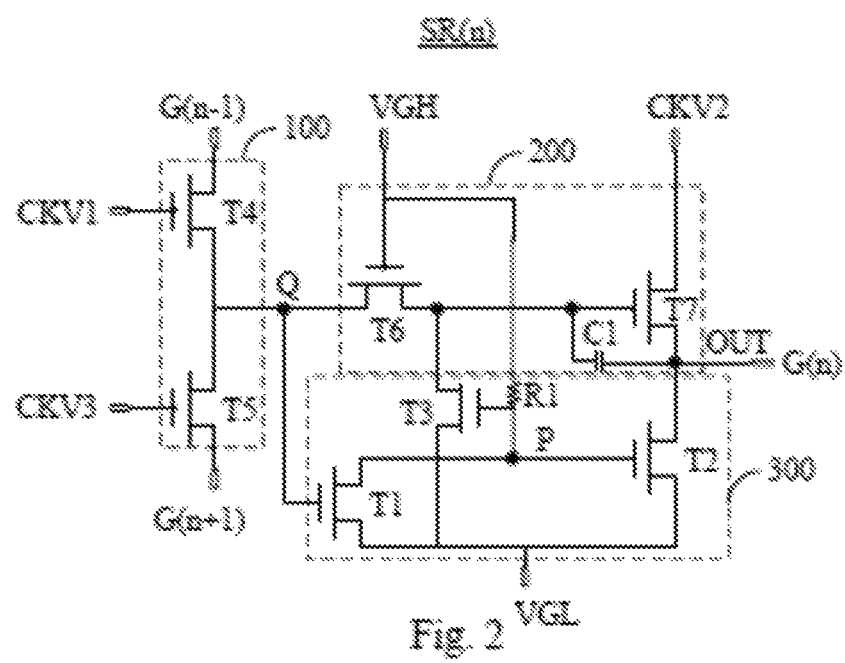
FIG. 2 is a circuit diagram of a GOA circuit unit SR(n) according to a first embodiment of the present invention.

Please refer to FIG. 2. FIG. 2 is a circuit diagram of a GOA circuit unit SR(n) according to a first embodiment of the present invention. A GOA circuit 12 comprises a plurality of GOA circuit units SR(n) connected in cascade. The GOA circuit unit SR(n) at each stage is used for outputting a scanning signal G(n) at an output terminal OUT according to a scanning signal G(n−1) output by a GOA circuit unit SR(n−1) at a previous stage, a scanning signal G(n+1) output by a GOA circuit unit SR(n+1) at a next stage, a first clock signal CKV1, a second clock signal CKV2, and a third clock signal CKV3. The GOA circuit unit SR(n) at each stage comprises an input control module 100, an output control module 200, and a pull-down module 300. The input control module 100 is used for outputting a controlling signal Q(n) at a controlling node Q according to the first clock signal CKV1 and the third clock signal CKV3. The output control module 200 is electrically connected to the controlling node Q and used for outputting a scanning signal G(n) at the output terminal OUT according to the controlling signal Q(n) and the second clock signal CKV2. The pull-down module 300 is electrically connected to the output control module 200 and used for pulling the scanning signal G(n) down to be at low level.

The pull-down 300 comprises a first transistor T1, a second transistor T2 a third transistor T3, and a resistor R1. A gate of the first transistor T1 is electrically connected to the controlling node Q. A drain of the first transistor T1 is electrically connected to a pull-down driving node P. A source of the first transistor T1 is electrically connected to a first constant voltage VGL. A gate of the second transistor T2 is electrically connected to the pull-down driving node P. A drain of the second transistor T2 is electrically connected to the output terminal OUT. A source of the second transistor T2 is electrically connected to the first constant voltage VGL. A gate of the third transistor T3 is electrically connected to the pull-down driving node P. A source of the third transistor T3 is electrically connected to the first constant voltage VGL. Two terminals of the resistor R1 are electrically connected to a second constant voltage VGH and the pull-down driving node P, respectively.

The input control module 100 comprises a fourth transistor T4 and a fifth transistor T5. A gate of the fourth transistor T4 is electrically connected to the first clock signal CKV1.

A drain of the fourth transistor T4 is electrically connected to the scanning signal G(n−1) output by the GOA circuit unit SR(n−1) at the previous stage. A source of the fourth transistor T4 is electrically connected to the controlling node Q. A gate of the fifth transistor T5 is electrically connected to the third clock signal CKV3. A drain of the fifth transistor T5 is electrically connected to the controlling node Q. A source of the fifth transistor T5 is electrically connected to the scanning signal G(n+1) output by the GOA circuit unit SR(n+1) at the next stage.

The output control module 200 comprises a sixth transistor T6, a seventh transistor T7, and a capacitor C1. A gate of the sixth transistor T6 is electrically connected to the second constant voltage VGH. A drain of the sixth transistor T6 is electrically connected to the controlling node Q. A source of the sixth transistor T6 is electrically connected to a drain of the third transistor T3. A gate of the seventh transistor T7 is electrically connected to a source of the sixth transistor T6. A drain of the seventh transistor T7 is electrically connected to the second clock signal CKV2. A source of the seventh transistor T7 is electrically connected to the output terminal OUT. Two terminals of the capacitor C1 are connected to the source and gate of the seventh transistor T7, respectively.

Each of transistors is an N-type metal oxide semiconductor (NMOS) transistor as shown in FIG. 2. The pulse of the first clock signal CKV1, the pulse of the second clock signal CKV2, and the pulse of the third clock signal CKV3 are alternatively output. Also, the three pulses never overlap with one another. The first constant voltage VGL is at low level. The second constant voltage VGH is at high level.

Figure 3:
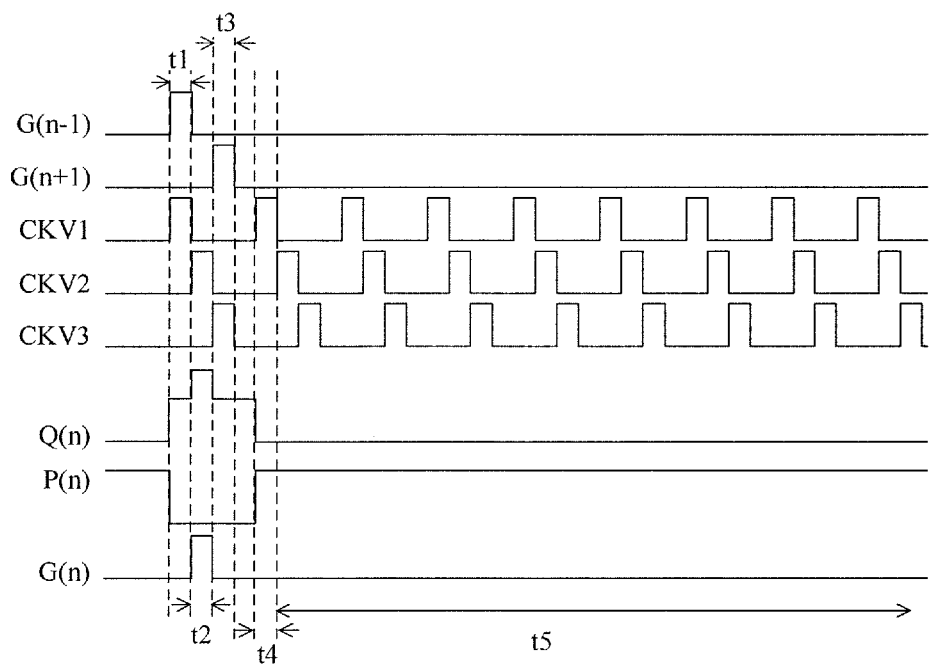
FIG. 3 is a timing diagram of input signals, output signals, and node voltage shown in FIG. 2 in forward scanning.

Please refer to FIG. 2 and FIG. 3. FIG. 3 is a timing diagram of input signals, output signals, and node voltage shown in FIG. 2 in forward scanning. The first clock signal CKV1 and the scanning signal G(n−1) are at high level during the period of t1 as shown in FIG. 3. Meanwhile, the fourth transistor T4 is turned on. The scanning signal G(n−1) at high level is transmitted to the controlling node Q through the fourth transistor T4. Also, the controlling signal Q(n) is at high level at this time. Since the second constant voltage VGH is at high level, the sixth transistor T6 keeps being turned on, and the controlling signal Q(n) at high level is conducted by sixth transistor T6 to charge the capacitor C1. Meanwhile, the first transistor T1 is turned on because of the controlling signal Q(n) at high level. The first constant voltage VGL at low level is transmitted to the pull-down driving node P through first transistor T1. So the pull-down driving node P(n) becomes at low level. During the period of t2, the second clock signal CKV2 at high level is conducted by the seventh transistor T7 and sent to the output terminal OUT because the capacitor C1 has electric charge so that the scanning signal G(n) becomes at high level. During the period of t3, the third clock signal CKV3 and the scanning signal G(n+1) are at high level. Meanwhile, the fifth transistor T5 is turned on. The scanning signal G(n+1) at high level is transmitted to the controlling node Q through the fifth transistor T5. The controlling signal Q(n) at high level is transmitted to the gate of the seventh transistor T7 through the sixth transistor T6 so that the second clock signal CKV2 at low level is conducted by the seventh transistor T7 and sent to the output terminal OUT. So the scanning signal G(n) becomes at low level. During the period of t4, the first clock signal CKV1 is at high level and the scanning signal G(n−1) is at low level. Meanwhile, the fourth transistor T4 is turned on. The scanning signal G(n−1) is at low level is transmitted to the controlling node Q through the fourth transistor T4. So the controlling signal Q(n) becomes at low level. During the period of t5, the controlling signal Q(n) is at low level so the first transistor T1 is turned off. The pull-down driving node P(n) becomes at high level because of the influence of the second constant voltage VGH. Meanwhile, the first constant voltage VGL at low level is conducted by the second transistor T2 and the third transistor T3. So the level of the seventh transistor T7 and the scanning signal G(n) are at low level, which ensures that the controlling signal Q(n) and the scanning signal G(n) to keep at low level stably.

Figure 4:
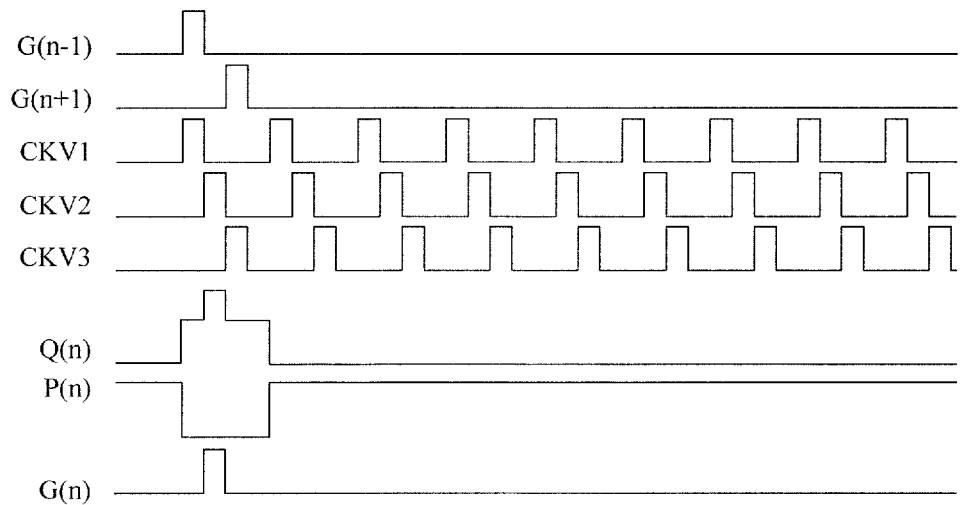
FIG. 4 is a timing diagram of a variety of input signals, output signals, and node voltage shown in FIG. 2 in backward scanning.

FIG. 4 is a timing diagram of a variety of input signals, output signals, and node voltage shown in FIG. 2 in backward scanning. FIG. 4 is different from FIG. 3 because a slight difference between the timing of forward scanning and the timing of backward scanning. However, it is understood by the people skilled in the field that the timing of forward scanning is different from the timing of backward scanning upon observing the structure of the GOA circuit unit SR(n) shown in FIG. 2. No further details are described in this specification.

Each of the transistors in this embodiment is an NMOS transistor as described above. But it is only an example for demonstration. The people skilled in the art are able to fabricate a GOA circuit unit comprising all P-type metal-oxide-semiconductor (PMOS) transistors or a GOA circuit unit comprising some NMOS transistors and some PMOS transistors based on the circuit proposed by the present invention. The GOA circuit unit with the same function as mentioned above can be also fabricated. No further details are described in this specification.

Compared with conventional technology, the GOA circuit unit SR(n) of the GOA circuit 12 proposed by the present invention comprises fewer transistors and fewer capacitors. Therefore, the GOA circuit unit is beneficial for being used in displays with a narrow bezel. In addition, the GOA circuit unit SR(n) omits a capacitor so power generated after the capacitor is charged is reduced. It provides a beneficiary effect of reducing power of the whole GOA circuit.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) circuit, comprising:
a plurality of GOA circuit units coupled in series, each of the plurality of GOA circuit units at each stage for outputting a scanning signal at an output terminal according to a scanning signal output by a GOA circuit unit at a previous stage, a scanning signal output by a GOA circuit unit at a next stage, a first clock signal, a second clock signal, and a third clock signal, wherein each of the plurality of GOA circuit units at each stage comprises:
an input control module, for outputting a controlling signal at a controlling node according to the first clock signal and the third clock signal;
an output control module, electrically connected to the controlling node, for outputting the scanning signal at the output terminal according to the controlling signal and the second clock signal; and
a pull-down module, electrically connected to the output control module, for pulling the scanning signal down to be at low level, comprising:
a first transistor, comprising a gate electrically connected to the controlling node, a drain electrically connected to a pull-down driving node, and a source electrically connected to a first constant voltage;
a second transistor, comprising a gate electrically connected to the pull-down driving node, a drain electrically connected to the output terminal, and a source electrically connected to the first constant voltage;
a third transistor, comprising a gate electrically connected to the pull-down driving node, and a source electrically connected to the first constant voltage; and
a resistor, comprising two terminals electrically connected to a second constant voltage and the pull-down driving node, respectively,
wherein a pulse of the first clock signal, a pulse of the second clock signal, and a pulse of the third clock signal are alternatively output, and the three pulses never overlap with one another, and wherein the first constant voltage is at low level, and the second constant voltage is at high level.

2. A gate driver on array (GOA) circuit, comprising:
a plurality of GOA circuit units coupled in series, each of the plurality of GOA circuit units at each stage for outputting a scanning signal at an output terminal according to a scanning signal output by a GOA circuit unit at a previous stage, a scanning signal output by a GOA circuit unit at a next stage, a first clock signal, a second clock signal, and a third clock signal, wherein each of the plurality of GOA circuit units at each stage comprises:
an input control module, for outputting a controlling signal at a controlling node according to the first clock signal and the third clock signal;
an output control module, electrically connected to the controlling node, for outputting the scanning signal at the output terminal according to the controlling signal and the second clock signal; and
a pull-down module, electrically connected to the output control module, for pulling the scanning signal down to be at low level, comprising:
a first transistor, comprising a gate electrically connected to the controlling node, a drain electrically connected to a pull-down driving node, and a source electrically connected to a first constant voltage;
a second transistor, comprising a gate electrically connected to the pull-down driving node, a drain electrically connected to the output terminal, and a source electrically connected to the first constant voltage;
a third transistor, comprising a gate electrically connected to the pull-down driving node, and a source electrically connected to the first constant voltage; and
a resistor, comprising two terminals electrically connected to a second constant voltage and the pull-down driving node, respectively
wherein a pulse of the first clock signal, a pulse of the second clock signal, and a pulse of the third clock signal are alternatively output, and the three pulses never overlap with one another.

3. The GOA circuit of claim 2, wherein the input control module comprises:
a fourth transistor, comprising a gate electrically connected to the first clock signal, a drain electrically connected to the scanning signal output by the GOA circuit unit at the previous stage, and a source electrically connected to the controlling node;
a fifth transistor, comprising a gate electrically connected to the third clock signal, a drain electrically connected to the controlling node, and a source electrically connected to the scanning signal output by the GOA circuit unit at the next stage.

4. The GOA circuit of claim 3, wherein the output control module comprises:
a sixth transistor, comprising a gate electrically connected to the second constant voltage, a drain electrically connected to the controlling node, and a source electrically connected to a drain of the third transistor;
a seventh transistor, comprising a gate electrically connected to the source of the sixth transistor, a drain electrically connected to the second clock signal, and a source electrically connected to the output terminal; and
a capacitor, connected between the source and the gate of the seventh transistor, respectively.

5. The GOA circuit of claim 2, wherein the first constant voltage is at low level, and the second constant voltage is at high level.

6. A display comprising:
a source driver, for outputting data signal to a plurality of pixel units to show images; and
a gate driver on array (GOA) circuit, comprising:
a plurality of GOA circuit units coupled in series, each of the plurality of GOA circuit units at each stage for outputting a scanning signal at an output terminal according to a scanning signal output by a GOA circuit unit at a previous stage, a scanning signal output by a GOA circuit unit at a next stage, a first clock signal, a second clock signal, and a third clock signal, wherein each of the plurality of GOA circuit units at each stage comprises:
an input control module, for outputting a controlling signal at a controlling node according to the first clock signal and the third clock signal;
an output control module, electrically connected to the controlling node, for outputting the scanning signal at the output terminal according to the controlling signal and the second clock signal; and
a pull-down module, electrically connected to the output control module, for pulling the scanning signal down to be at low level, comprising:
a first transistor, comprising a gate electrically connected to the controlling node, a drain electrically connected to a pull-down driving node, and a source electrically connected to a first constant voltage;
a second transistor, comprising a gate electrically connected to the pull-down driving node, a drain electrically connected to the output terminal, and a source electrically connected to the first constant voltage;
a third transistor, comprising a gate electrically connected to the pull-down driving node, and a source electrically connected to the first constant voltage; and
a resistor, comprising two terminals electrically connected to a second constant voltage and the pull-down driving node, respectively,
wherein a pulse of the first clock signal, a pulse of the second clock signal, and a pulse of the third clock signal are alternatively output, and the three pulses never overlap with one another.

7. The display of claim 6, wherein the input control module comprises:
- a fourth transistor, comprising a gate electrically connected to the first clock signal, a drain electrically connected to the scanning signal output by the GOA circuit unit at the previous stage, and a source electrically connected to the controlling node;
- a fifth transistor, comprising a gate electrically connected to the third clock signal, a drain electrically connected to the controlling node, and a source electrically connected to the scanning signal output by the GOA circuit unit at the next stage.

8. The display of claim 7, wherein the output control module comprises:
- a sixth transistor, comprising a gate electrically connected to the second constant voltage, a drain electrically connected to the controlling node, and a source electrically connected to a drain of the third transistor;
- a seventh transistor, comprising a gate electrically connected to the source of the sixth transistor, a drain electrically connected to the second clock signal, and a source electrically connected to the output terminal; and
- a capacitor, connected between the source and the gate of the seventh transistor, respectively.

9. The display of claim 6, wherein the first constant voltage is at low level, and the second constant voltage is at high level.

* * * * *